United States Patent
Liu et al.

(10) Patent No.: US 12,150,280 B2
(45) Date of Patent: Nov. 19, 2024

(54) SYSTEM AND METHOD TO HELP MITIGATE HEAT IN AN ELECTRONIC DEVICE

(71) Applicant: Intel Corporation, Santa Clara, CA (US)

(72) Inventors: Baomin Liu, Austin, TX (US); Rob W. Sims, Forest Grove, OR (US); Kannan G. Raja, Beaverton, OR (US); Linden H. McClure, Beaverton, OR (US); Gopinath Kandasamy, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 801 days.

(21) Appl. No.: 17/130,689

(22) Filed: Dec. 22, 2020

(65) Prior Publication Data

US 2021/0112679 A1  Apr. 15, 2021

(51) Int. Cl.
*H05K 7/20* (2006.01)
*G06F 1/20* (2006.01)

(52) U.S. Cl.
CPC ......... *H05K 7/205* (2013.01); *H05K 7/20418* (2013.01); *G06F 1/203* (2013.01); *H05K 7/20309* (2013.01)

(58) Field of Classification Search
CPC ............... H05K 7/205; H05K 7/20418; H05K 7/20309; G06F 1/203; G06F 1/20
See application file for complete search history.

(56) References Cited

U.S. PATENT DOCUMENTS

| 5,768,104 | A  | * | 6/1998  | Salmonson | H05K 7/20454 257/714 |
| 7,045,890 | B2 | * | 5/2006  | Xie       | H01L 23/10 257/710 |
| 7,091,586 | B2 | * | 8/2006  | Millik    | H01L 23/36 257/E23.101 |
| 2010/0139895 | A1 | * | 6/2010 | Hwang    | H01L 23/427 165/104.26 |
| 2011/0024086 | A1 |   | 2/2011  | Tan et al. | |
| 2015/0323262 | A1 |   | 11/2015 | Kim      | |

(Continued)

FOREIGN PATENT DOCUMENTS

| CN | 110708934 A | 1/2020 |
| EP | 4020122 A1 | 6/2022 |

OTHER PUBLICATIONS

European Extended Search Report issued in EP Application No. 21 196 777.3 on Feb. 23, 2022; 9 pages.

*Primary Examiner* — Stephen S Sul
(74) *Attorney, Agent, or Firm* — Banner & Witcoff Ltd

(57) ABSTRACT

Particular embodiments described herein provide for an electronic device that can be configured to include a substrate, a plurality of heat sources on the substrate, a heat spreader that extends over the plurality of heat sources, and a plurality of heat spreader mounting brackets. Each of the plurality of heat spreader mounting brackets are over a corresponding heat source from the plurality of heat sources and the plurality of heat spreaders secure the heat spreader to the substrate without extending through the heat spreader. In some examples, the heat spreader is a vapor chamber and the plurality of heat spreader mounting brackets are soldered to the vapor chamber.

15 Claims, 14 Drawing Sheets

(56) References Cited

U.S. PATENT DOCUMENTS

| | | | |
|---|---|---|---|
| 2016/0106003 A1* | 4/2016 | Bosak | H01L 23/427 |
| | | | 361/717 |
| 2017/0221793 A1* | 8/2017 | Smalley | H01L 25/0655 |
| 2018/0347921 A1* | 12/2018 | Morrison | H01L 23/3733 |
| 2018/0350718 A1* | 12/2018 | Lin | H01L 21/4882 |
| 2019/0050031 A1 | 2/2019 | Utz et al. | |
| 2019/0269005 A1* | 8/2019 | He | H01L 23/4006 |
| 2019/0324507 A1* | 10/2019 | Carbone | H05K 7/20336 |
| 2019/0387645 A1* | 12/2019 | Helberg | G06F 1/1632 |
| 2020/0045850 A1* | 2/2020 | Bala | H05K 7/20436 |
| 2020/0081500 A1* | 3/2020 | Shaw | G06F 1/166 |
| 2020/0152546 A1 | 5/2020 | Refai-Ahmed et al. | |
| 2020/0350229 A1* | 11/2020 | Chang | H01L 23/3733 |
| 2020/0379522 A1* | 12/2020 | Andre | G06F 1/183 |
| 2022/0179461 A1* | 6/2022 | North | G06F 1/1688 |

* cited by examiner

SYSTEM AND METHOD TO HELP MITIGATE HEAT IN AN ELECTRONIC DEVICE

TECHNICAL FIELD

This disclosure relates in general to the field of computing and/or device cooling, and more particularly, to a system and method to help mitigate heat in an electronic device.

BACKGROUND

Emerging trends in systems place increasing performance demands on the system. The increasing demands can cause heat increases in the system. The heat increases can cause a reduction in device performance, a reduction in the lifetime of a device, and delays in data throughput.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

Figure 1A:
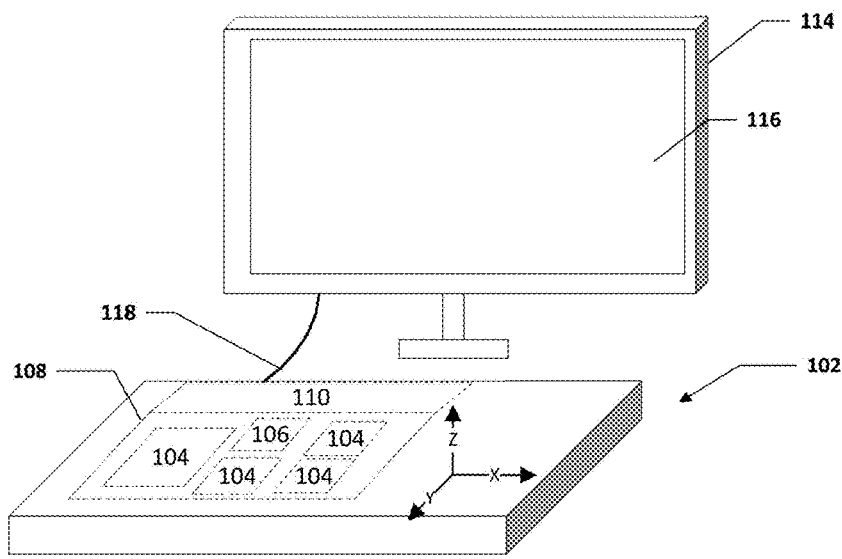
FIGS. 1A and 1B are a simplified block diagram of an electronic device configured to help mitigate heat in the electronic device, in accordance with an embodiment of the present disclosure.

The FIGURES of the drawings are not necessarily drawn to scale, as their dimensions can be varied considerably without departing from the scope of the present disclosure.

DETAILED DESCRIPTION

The following detailed description sets forth examples of apparatuses, methods, and systems relating to a system and method to help mitigate heat in an electronic device. As used herein, the term "system and method to help mitigate heat" refers to one or more means, systems, configurations, methods, etc. that try to help cool down or reduce the temperature of an electronic device and/or portions of the electronic device. Features such as structure(s), function(s), and/or characteristic(s), for example, are described with reference to one embodiment as a matter of convenience; various embodiments may be implemented with any suitable one or more of the described features.

In the following description, various aspects of the illustrative implementations will be described using terms commonly employed by those skilled in the art to convey the substance of their work to others skilled in the art. However, it will be apparent to those skilled in the art that the embodiments disclosed herein may be practiced with only some of the described aspects. For purposes of explanation, specific numbers, materials, and configurations are set forth in order to provide a thorough understanding of the illustrative implementations. However, it will be apparent to one skilled in the art that the embodiments disclosed herein may be practiced without the specific details. In other instances, well-known features are omitted or simplified in order not to obscure the illustrative implementations.

The terms "over," "under," "below," "between," and "on" as used herein refer to a relative position of one layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "directly on" a second layer is in direct contact with that second layer. Similarly, unless explicitly stated otherwise, one feature disposed between two features may be in direct contact with the adjacent features or may have one or more intervening layers.

In the following detailed description, reference is made to the accompanying drawings that form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

FIG. 1A is a simplified block diagram of an electronic device configured to help mitigate heat in the electronic device, in accordance with an embodiment of the present disclosure. In an example, electronic device 102 can include one or more heat sources 104, one or more electronic components 106, a heat spreader 108, and a heat sink 110. Electronic device 102 can be in communication with a second electronic device 114. As illustrated in FIG. 1A, second electronic device 114 is a display panel and can include a display screen 116. Electronic device 102 can be in communication with second electronic device 114 using communication link 118. Communication link 118 may be a wired communication link or a wireless communication link.

Figure 1B:
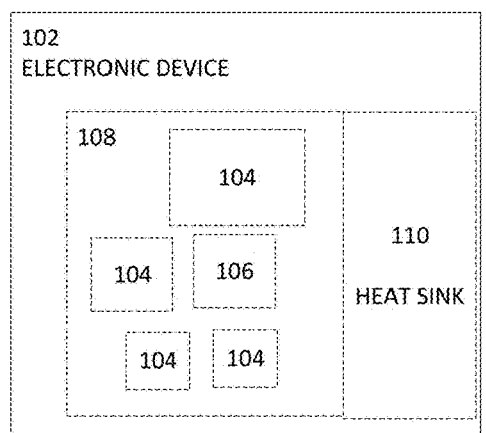
Figure 1B:
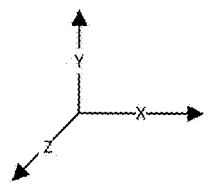

Turning to FIG. 1B, FIG. 1B is a simplified block diagram of an electronic device configured to help mitigate heat in the electronic device, in accordance with an embodiment of the present disclosure. In an example, electronic device 102 can include one or more heat sources 104, one or more electronic components 106, heat spreader 108, and heat sink 110. Electronic device 102 can be a compact desktop system.

Each of one or more heat sources 104 may be a heat generating device (e.g., processor, logic unit, field programmable gate array (FPGA), chip set, a graphics processor, graphics card, battery, memory, or some other type of heat generating device). One or more electronic components 106 are electronic components that help facilitate the operation of electronic device 102. Each of electronic components 106 may or may not be a heat generating device and if one or more is a heat generating device, the heat generated by the heat generating electronic component 106 is relatively small compared to the heat generated by each of one or more heat sources 104. Heat spreader 108 can be a vapor chamber or some other type of device that can transfer heat or thermal energy from one area to another area (e.g., from a heat source 104 to heat sink 110). Heat sink 110 is configured as an air-cooling system to transfer at least some of the heat collected by heat spreader 108 away from electronic device to help reduce the temperature or thermal energy of one or more heat sources 104. In some examples, heat sink 110 includes one or more fans that blow air over fins and expel relatively warm air to the environment around electronic device 102.

In an illustrative example, one or more heat sources 104 can be critical components (e.g., computer processing unit (CPU), graphics processing unit (GPU), discrete GPU (dGPU), graphics double data rate (GDDR) memory, voltage regulators, etc.) and they can all be covered by heat spreader 108. A unified heat spreader 108 that covers the critical components, especially both the CPU and GPU, can provide more cooling capability for performance boost and overclocking for the CPU and the GPU than isolated heat spreaders for the CPU and the GPU. In some examples, heat spreader 108 may be a curved vapor chamber with an integrated fin stack, local support pedestals, and slopes to account for components of different profiles and height and to transition from a CPU motherboard to a GPU board. More specifically, compared with a conventional flat design, heat spreader 108 can be curved up when it extends from the CPU board to the GPU board to account for relatively tall peripheral component interconnect express (PCIE) connectors. Heat spreader 108 may also include local support pedestals to reach and cool components of different heights in electronic device and to accommodate the different heights of the different components in electronic device. The support pedestals (e.g., copper blocks) can be customized to accommodate the different height of components in electronic device and secured (e.g., soldered, adhesive tape, etc.) to heat spreader 108 after fabrication of heat spreader 108 per the dimensions and locations of the different components to make heat spreader 108 flat and simple for easy fabrication and low cost.

In addition, an assembly process can be used to avoid creating mounting holes through the critical areas on heat spreader 108 and help to ensure relatively high performance from heat spreader 108, especially if heat spreader 108 is a vapor chamber. Mounting holes through a vapor chamber can degrade the performance of the vapor chamber by thirty percent (30%) or more depending on the hole locations and system details. To help solve this problem, a heat spreader mounting bracket with substrate attachment posts can be secured to heat spreader 108 in each of the areas where heat spreader 108 will be over a heat source 104. More specifically, a heat spreader mounting bracket with substrate attachment posts can be secured to heat spreader 108 in the area where heat spreader 108 is over the CPU and a heat spreader mounting bracket with substrate attachment posts can be secured to heat spreader 108 in the area where heat spreader 108 is over the GPU. The substrate attachment posts on the heat spreader 108 can couple with a heat spreader mounting mechanism (e.g., screw) that extends through the substrate to help enable a reliable contact between heat source 104 and heat spreader. More specifically, the heat spreader mounting mechanism can extend through the substrate and couple with the substrate attachment posts on the heat spreader mounting bracket to pull or otherwise secure heat spreader 108 over heat sources 104. This avoids through holes for mounting and thus achieves more cooling from heat spreader 108, especially if heat spreader 108 is a vapor chamber. In some examples, the feet of electronic device 102 can be configured to elevate and support electronic device 102 as well as to help prevent hot air recirculation by restricting hot exhaust air from the system from being drawn into the airflow intakes. Components that may be accessed by a user (e.g., SO-DIMMs, M.2 modules, etc.) may be left uncovered by heat spreader 108 to allow easy access to the components by the user.

The system can use an assembly procedure that includes assembling the substrate, heat spreader 108, and heat sink 110 together on an intermediate backplate outside the chassis. Then, the subassembly can be placed into the chassis of electronic device 102. There can be mounting holes on the substrate portions that are not covered by the heat spreader 108 and through these mounting holes, the whole subassembly of the substrate, heat spreader 108, heat sink 110, etc. is mounted to the chassis cover or an internal structure of electronic device 102 via screws. The intermediate backplate can have multiple cut-outs to account for the high-profile components on the back side of the substrate or to reduce the weight of the intermediate backplate. The intermediate backplate may also provide a guide and support for the cable management and the mounting of hard drives, etc. In addition, the intermediate backplate can be used as a heat sink for the components on the back of the substrate if necessary.

It is to be understood that other embodiments may be utilized and structural changes may be made without departing from the scope of the present disclosure. Substantial flexibility is provided by electronic device 102 in that any suitable arrangements and configuration may be provided without departing from the teachings of the present disclosure.

As used herein, the term "when" may be used to indicate the temporal nature of an event. For example, the phrase "event 'A' occurs when event 'B' occurs" is to be interpreted to mean that event A may occur before, during, or after the occurrence of event B, but is nonetheless associated with the occurrence of event B. For example, event A occurs when event B occurs if event A occurs in response to the occurrence of event B or in response to a signal indicating that event B has occurred, is occurring, or will occur. Reference to "one embodiment" or "an embodiment" in the present disclosure means that a particular feature, structure, or characteristic described in connection with the embodiment is included in at least one embodiment. The appearances of the phrase "in one embodiment" or "in an embodiment" are not necessarily all referring to the same embodiment.

For purposes of illustrating certain example techniques of electronic device 102, the following foundational information may be viewed as a basis from which the present disclosure may be properly explained. End users have more media and communications choices than ever before. A number of prominent technological trends are currently afoot (e.g., more computing elements, more online video services, more Internet traffic, more complex processing, etc.), and these trends are changing the expected performance of devices as devices and systems are expected to increase performance and function. However, the increase in performance and/or function causes an increase in the thermal challenges of the devices and systems, especially compact desktop systems.

Existing compact desktop systems, such as all-in-ones and other small form factor desktop personal computers mainly focus on thin chassis with mobile or entry level desk top processors with low or medium level performance. In addition, graphics options are often limited to mobile or on-board versions. Some existing system and method to help mitigate heat for compact desktop personal computers include traditional metal heat sinks with fans, heat pipes and metal thermal plates. The biggest disadvantage of the existing systems and methods to help mitigate heats is that they typically only support CPU power up to forty-five (45) watts and GPU power up to eighty (80) watts. This is far below a performance target for high performance compact desktop with a CPU power at ninety-five (95) watts or above and a GPU power at one-hundred and eighty (180) watts or above. Existing systems and methods to help mitigate heat for high performance compact desktop personal computers are not readily available. More specifically, most existing systems and methods to help mitigate heat for high performance compact desktops are typically thick and bulky and thus cannot fit into the a compact, relatively thin chassis. For example, some heat pipe solutions have a relatively large overall thickness of the heat pipe plus the thermal plates and can reach ten (10) millimeters or more for high power applications. In addition, many of the critical components, such as voltage regulators, are left behind by the current heat pipe-based systems and methods and those leftover components can either become over heated or require additional air cooling which drives more air gaps into the design stack-up and therefore thicker chassis. What is needed is a system and method to help mitigate heat in an electronic device.

A system and method to help mitigate heat in an electronic device, as outlined in FIGS. 1A and 1B, can resolve these issues (and others). In an example, a heat spreader (e.g., heat spreader 108) can be configured to cover a plurality heat sources in an electronic device. In a specific example, the heat spreader is a vapor chamber and the plurality of heat sources includes critical components in the electronic device, especially both the CPU and GPU. The heat spreader can be configured to cover the plurality heat sources and help to provide cooling capability for performance boosting and overclocking.

More specifically, if the heat sources include a CPU and a GPU a heat spreader can be configured to cover both and can help mitigate the heat from the CPU and the GPU better than isolated and separate heat spreaders for the CPU and the GPU. In a specific example, the heat spreader is a vapor chamber and the vapor chamber can be a unified vapor chamber that combines the CPU and the GPU vapor chamber as one and thus can provide more cooling for either the CPU or the GPU for overclocking, or can support both the CPU and the GPU simultaneously for high balanced CPU and GPU performance. In addition to the CPU and the GPU, the heat spreader can also cover other heat sources such as voltage regulators, graphics double data rate (GDDR) memory chips, and PCH to help provide cooling for these critical components under conditions such as overclocking. In an example, some existing systems do not cover the voltage regulators and there may not be enough airflow to the voltage regulators so the voltage regulators are not properly cooled enough. This can impact the system even though the processor may be properly cooled. Because the heat spreader covers the CPU, GPU, and other critical components, it is a system level cooling instead of a specific CPU or GPU cooling.

In some examples, the heat spreader may be a curved heat spreader with an integrated fin stack, support pedestals, and slopes to account for components of different profiles and height and to transition from a CPU motherboard to a GPU board. More specifically, compared with a conventional flat design, the heat spreader can be curved up when it extends from the CPU board to the GPU board to account for a relatively tall PCIE connector. The heat spreader can be relatively flat and simple for easy fabrication and low cost. The local bumps found in some current heat spreaders can be replaced with support pedestals (e.g., copper blocks) that can be customized and soldered to the heat spreader per the dimensions and locations of the components after the heat spreader i fabricated. This can allow for the reuse one flat heat spreader design with different support pedestals for multiple system designs at a relatively low cost.

Some existing vapor chambers use through holes which reduce the efficiency of the vapor chamber and thus cause thermal performance degradation. If the heat spreader is a vapor chamber, one or more heat spreader mounting brackets can be secured to the vapor chamber. The heat spreader mounting brackets can be secured to the vapor chamber without using holes through the vapor chamber to avoid thermal performance degradation of the vapor chamber. In an illustrative example, each of the one or more heat spreader mounting brackets can include four spring arms with a substrate attachment post on each of the spring arm. The spring arms can be configured to deform and keep a clamping force in specification when the heat spreader is assembled with the substrate. In a specific example, to help prevent the substrate attachment posts from being pulled and separated from the one or more heat spreader mounting brackets, standoffs with tabs larger than the holes may be used. The tabs larger than the holes help to prevent the substrate attachment posts being pulled off the heat spreader mounting bracket and thus help to reduce the separation risk of the heat spreader mounting brackets being separated from the vapor chamber.

Each of the one or more heat spreader mounting brackets can be soldered to the vapor chamber. The one or more heat spreader mounting brackets can be located over the substrate and heat spreader mounting mechanism (e.g., screws) can extend through the substrate to the substrate mounting posts on the one or more heat spreader mounting brackets. The heat spreader mounting brackets can be located such that they extend around each heat source and when the heat spreader mounting brackets are secured to the substrate using the substrate attachment posts, a force is applied downward on the heat source. The applied force from the heat spreader mounting bracket onto the heat source can be changed from heat source to heat source. The size of the one or more heat spreader mounting brackets, angle of the arms, etc. can all be adjusted to adjust the applied force on a specific heat source.

Also, some existing fans or blowers just guide the airflow from the blowers to a fin stack. In electronic device 102, a heat sink (e.g., heat sink 110) can include a split duct design to guide the airflow and hold the heat spreader and blowers with the heat sink together as one assembly for a relatively easier system build. To also aid in assembly, a system backplate design can be used to replace the default or currently used backplates for the CPU and the GPU. The system backplate can hold the CPU board, GPU board, and heat mitigating systems together for system assembly and provide additional cooling to the components on the substrate side. With different sets of mounting holes implemented, the backplate can support different CPU and GPU boards.

Direct air intake vents can be included in the chassis bottom cover in the blower positions and/or from other directions. Side vents can be applied to the left and right side covers of the chassis to provide addition air intake paths and help to reduce the foot height for a better industrial design. Conventional feet are typically just a few small blocks attached to the chassis bottom. In an example, a full-length foot on the back of the chassis can help to prevent the recirculation of the existing hot exhaust air from the heat sink from recirculating or getting back to the intake vents. The feet can be different shapes for a better industrial design.

In an example implementation, electronic device 102, is meant to encompass an all-in-one computer, a computer, a personal digital assistant (PDA), a laptop computer, an electronic notebook, network elements, network appliances, servers, routers, switches, gateways, bridges, load balancers, processors, modules, or any other device, component, element, or object that includes at least one heat source and at least one fan. Electronic device 102 may include any suitable hardware, software, components, modules, or objects that facilitate the operations thereof, as well as suitable interfaces for receiving, transmitting, and/or otherwise communicating data or information in a network environment. This may be inclusive of appropriate algorithms and communication protocols that allow for the effective exchange of data or information. Electronic device 102 may include virtual elements.

In regards to the internal structure, electronic device 102 can include memory elements for storing information to be used in operations. Electronic device 102 may keep information in any suitable memory element (e.g., random access memory (RAM), read-only memory (ROM), erasable programmable ROM (EPROM), electrically erasable programmable ROM (EEPROM), application specific integrated circuit (ASIC), etc.), software, hardware, firmware, or in any other suitable component, device, element, or object where appropriate and based on particular needs. Any of the memory items discussed herein should be construed as being encompassed within the broad term 'memory element.' Moreover, the information being used, tracked, sent, or received could be provided in any database, register, queue, table, cache, control list, or other storage structure, all of which can be referenced at any suitable timeframe. Any such storage options may also be included within the broad term 'memory element' as used herein.

In certain example implementations, functions may be implemented by logic encoded in one or more tangible media (e.g., embedded logic provided in an ASIC, digital signal processor (DSP) instructions, software (potentially inclusive of object code and source code) to be executed by a processor, or other similar machine, etc.), which may be inclusive of non-transitory computer-readable media. In some of these instances, memory elements can store data used for the operations. This includes the memory elements being able to store software, logic, code, or processor instructions that are executed to carry out the activities described herein.

In an example implementation, electronic device 102 may include software modules to achieve, or to foster, operations. These modules may be suitably combined in any appropriate manner, which may be based on particular configuration and/or provisioning needs. In example embodiments, such operations may be carried out by hardware, implemented externally to these elements, or included in some other network device to achieve the intended functionality. Furthermore, the modules can be implemented as software, hardware, firmware, or any suitable combination thereof. These elements may also include software (or reciprocating software) that can coordinate with other network elements in order to achieve the operations.

Additionally, electronic device 102 may include a processor (e.g., heat source 104) that can execute software or an algorithm to perform activities. A processor can execute any type of instructions associated with the data to achieve the operations. In one example, the processors could transform an element or an article (e.g., data) from one state or thing to another state or thing. In another example, the activities may be implemented with fixed logic or programmable logic (e.g., software/computer instructions executed by a processor) and the elements identified herein could be some type of a programmable processor, programmable digital logic (e.g., a field programmable gate array (FPGA), an erasable programmable read-only memory (EPROM), an electrically erasable programmable read-only memory (EEPROM)) or an ASIC that includes digital logic, software, code, electronic instructions, or any suitable combination thereof. Any of the potential processing elements, modules, and machines described herein should be construed as being encompassed within the broad term 'processor.'

Implementations of the embodiments disclosed herein may be formed or carried out on a substrate, such as a non-semiconductor substrate or a semiconductor substrate. In one implementation, the non-semiconductor substrate may be silicon dioxide, an inter-layer dielectric composed of silicon dioxide, silicon nitride, titanium oxide and other transition metal oxides. Although a few examples of materials from which the non-semiconducting substrate may be formed are described here, any material that may serve as a foundation upon which a non-semiconductor device may be built falls within the spirit and scope of the embodiments disclosed herein.

In another implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. In other examples, the substrate may be a flexible substrate including 2D materials such as graphene and molybdenum disulphide, organic materials such as pentacene, transparent oxides such as indium gallium zinc oxide poly/amorphous (low temperature of dep) III-V semiconductors and germanium/silicon, and other non-silicon flexible substrates. Although a few examples of materials from which the substrate may be formed are described here, any material that may serve as a foundation upon which a semiconductor device may be built falls within the spirit and scope of the embodiments disclosed herein.

Figure 2:
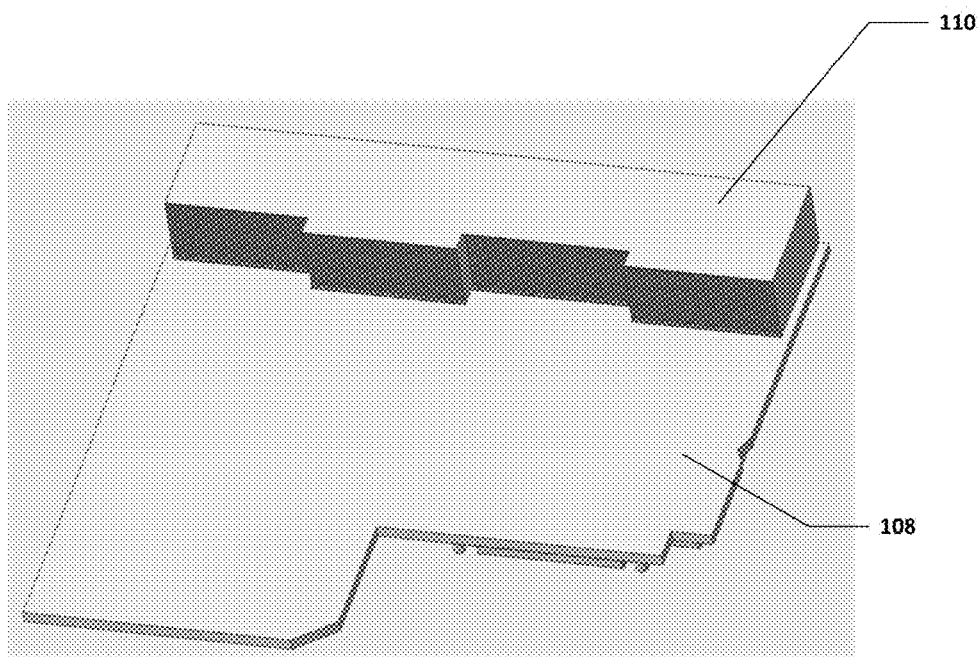
FIG. 2 is a simplified block diagram of a portion of electronic device configured to help mitigate heat in the electronic device, in accordance with an embodiment of the present disclosure.

Turning to FIG. 2, FIG. 2 is a simplified top view of a portion of electronic device 102 configured to mitigate heat in electronic device 102. In an example, heat spreader 108 can be coupled to heat sink 110. A top side of heat spreader 108 can be relatively flat. Heat spreader 108 can be configured collect heat from one or more heat sources and transfer the collected heat to heat sink 110. Heat sink 110 can be configured as an air-cooling system to help transfer the heat collected by heat spreader 108 to the environment around electronic device 102.

Figure 3:
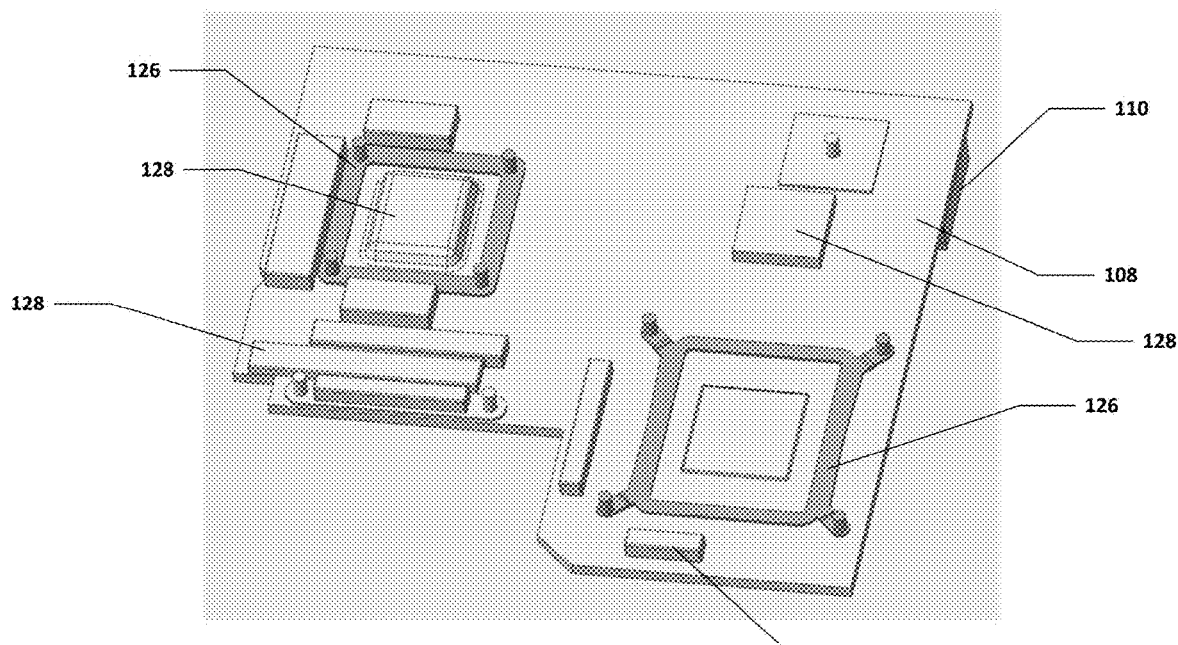
FIG. 3 is a simplified block diagram of a portion of electronic device configured to help mitigate heat in the electronic device, in accordance with an embodiment of the present disclosure.

Turning to FIG. 3, FIG. 3 is a simplified bottom view of a portion of electronic device 102 configured to mitigate heat in electronic device 102. In an example, heat spreader 108 can be coupled to heat sink 110. A bottom side of heat spreader 108 can include one or more heat spreader mounting brackets 126 and one or more support pedestals 128. Heat spreader mounting bracket 126 can be secured to the bottom side of heat spreader 108 without compromising heat spreader 108 or requiring through holes in heat spreader 108. In an example, each heat spreader mounting bracket 126 is secured to the bottom side of heat spreader 108 using solder, tape, adhesive, or some other means of securing heat spreader mounting bracket 126 to the bottom side of heat spreader 108 without compromising heat spreader 108 or requiring through holes in heat spreader 108. Support pedestals 128 help to account for the height different of different heat sources (e.g., heat source 104) and components (e.g., electronic components 106) and help to provide structural support for heat spreader 108. More specifically, due to the different height of heat sources and components in electronic device 102, support pedestals 128 help to account for the height differences and allow the top side of heat spreader 108 to have the relatively flat profile illustrated in FIG. 2. In an example, support pedestals 128 are added after heat spreader 108 is created or fabricated. Support pedestals 128 can be customized and soldered to heat spreader 108 per the dimensions and locations of the components in electronic device 102 after is created or fabricated. This can allow for the reuse of one flat heat spreader design with different support pedestals for multiple system designs at a relatively low cost.

Figure 4:
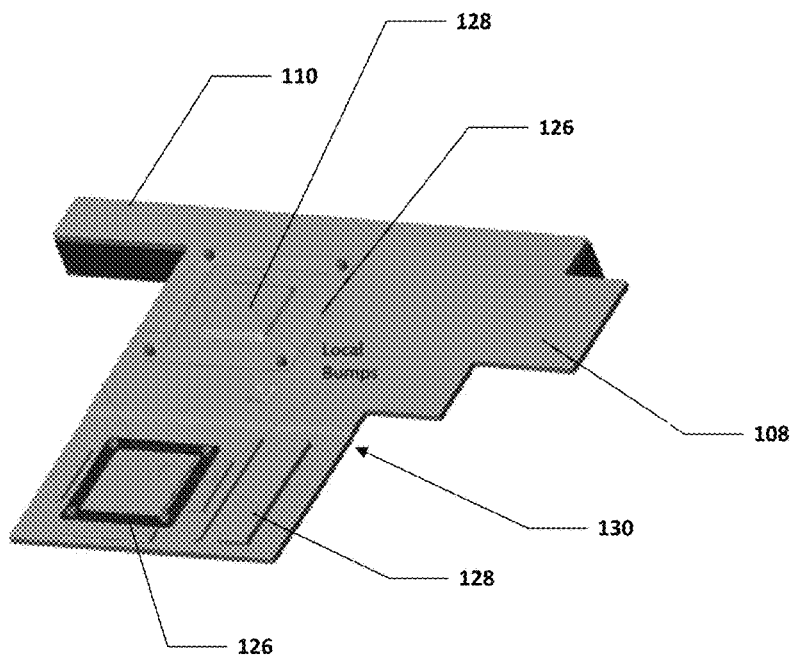
FIG. 4 is a simplified block diagram of a portion of electronic device configured to help mitigate heat in the electronic device, in accordance with an embodiment of the present disclosure.

Turning to FIG. 4, FIG. 4 is a simplified bottom view of a portion of electronic device 102 configured to mitigate heat in electronic device 102. In an example, heat spreader 108 can be coupled to heat sink 110. A bottom side of heat spreader 108 can include one or more heat spreader mounting brackets 126 and one or more support pedestals 128. Heat spreader mounting bracket 126 can be secured to the bottom side of heat spreader 108 without compromising heat spreader 108 or requiring through holes in heat spreader 108. In an example, heat spreader mounting bracket 126 is secured to the bottom side of heat spreader 108 using solder, tape, adhesive, or some other means of securing heat spreader mounting bracket 126 to the bottom side of heat spreader 108 without compromising heat spreader 108 or requiring through holes in heat spreader 108. Support pedestals 128 help to account for the height different of different heat sources (e.g., heat source 104) and components (e.g., electronic components 106) and help to provide structural support for heat spreader 108. In an example, heat spreader 108 can have a curve or ridge 130 to help account for the height different of different heat sources and components in electronic device 102. In a specific example, ridge 130 can help heat spreader accommodate the height different between a CPU board and a GPU board.

Figure 5:
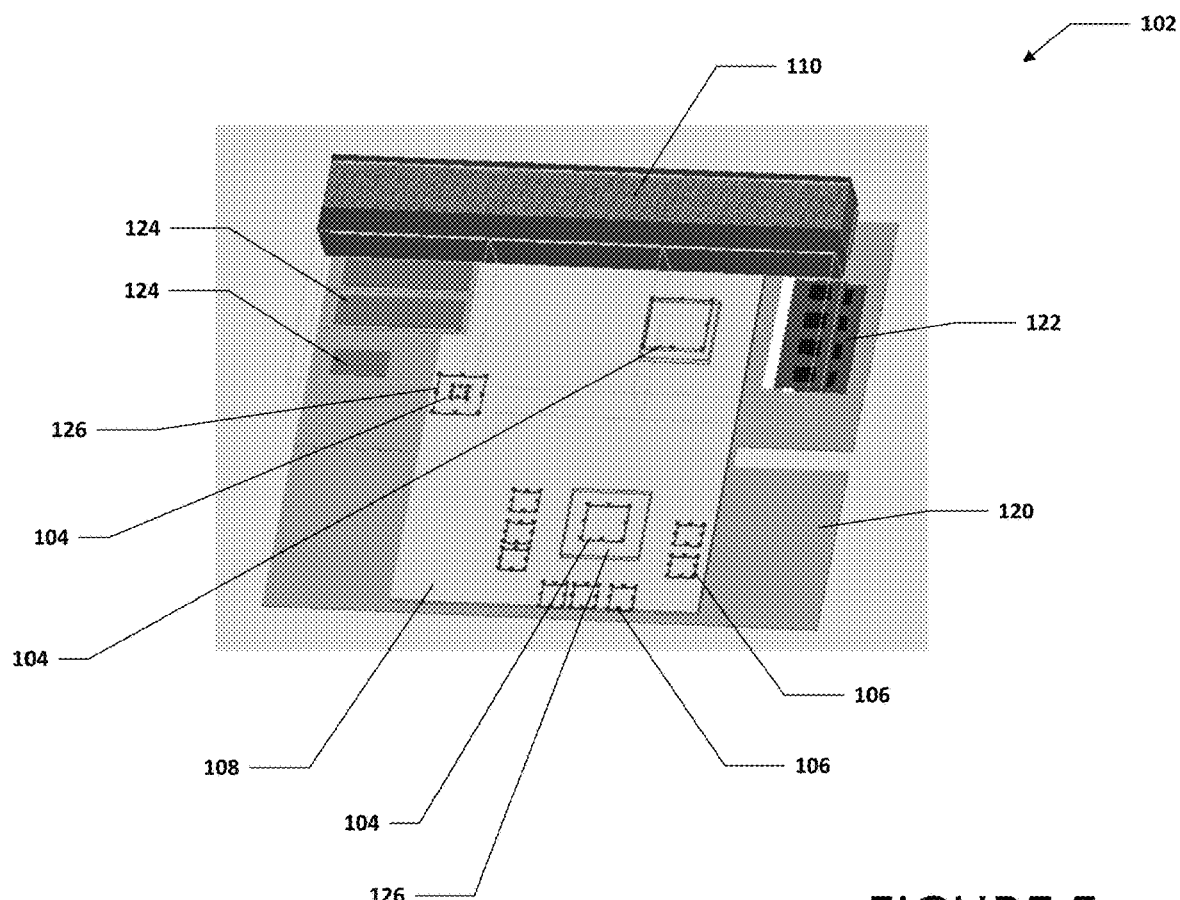
FIG. 5 is a simplified block diagram of a portion of electronic device configured to help mitigate heat in the electronic device, in accordance with an embodiment of the present disclosure.

Turning to FIG. 5, FIG. 5 is a simplified top view of a portion of electronic device 102 configured to mitigate heat in electronic device 102. As illustrated in FIG. 5, heat spreader 108 and heat sink 110 can be over a portion of a substrate 120. One or more heat sources 104 and one or more electronic components 106 can be on substrate 120. In addition, one or more removable components 122 and one or more thermally neutral components 124 can be on substrate 120. One or more removable components 122 are components that can be removed or are typically removed by a user from substrate (e.g., random access memory (RAM), etc.) and therefore, to allow for access to one or more removable component's 122 by the user, heat spreader 108 does not extend over them. One or more thermally neutral components 124 are components that do not contribute heat to electronic device 102 or cannot or should not be covered by heat spreader 108.

Figure 6:
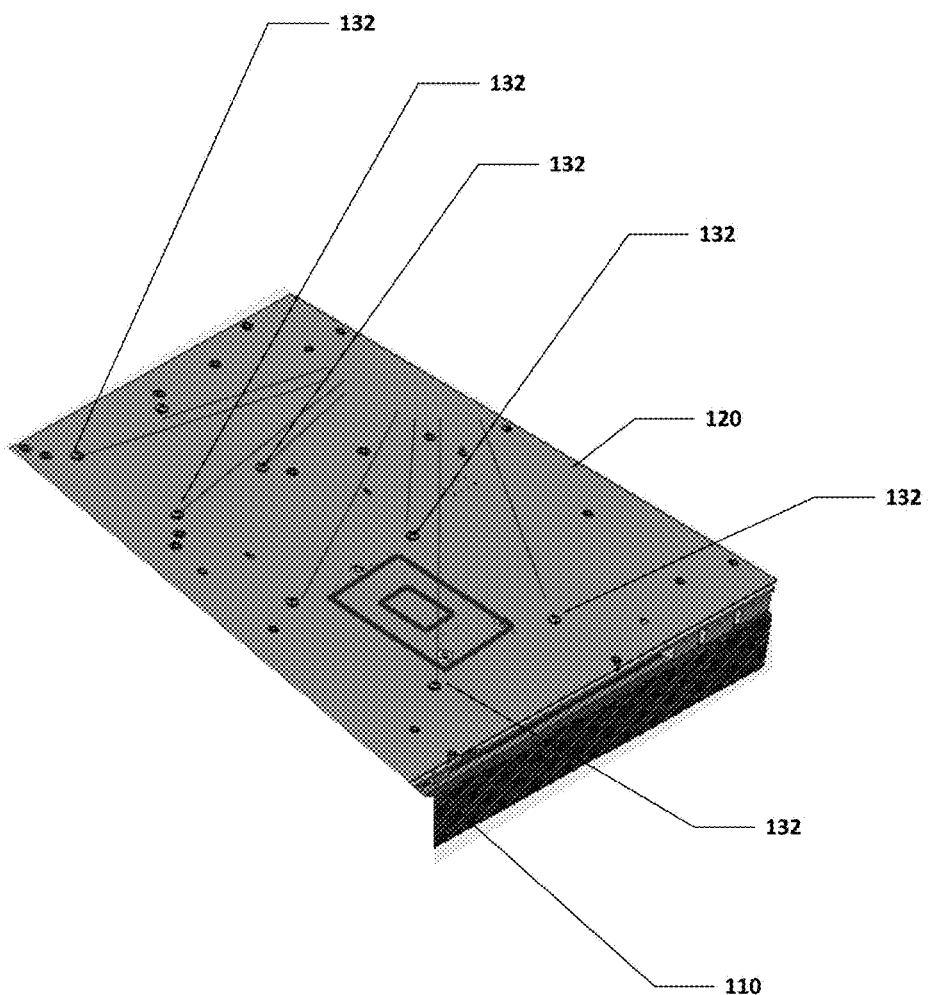
FIG. 6 is a simplified block diagram of a portion of electronic device configured to help mitigate heat in the electronic device, in accordance with an embodiment of the present disclosure.

Turning to FIG. 6, FIG. 6 is a simplified bottom view of a portion of electronic device 102 configured to mitigate heat in electronic device 102. As illustrated in FIG. 6, a bottom side of substrate 120, the side opposite of the top side of substrate 120 illustrated in FIG. 5, can include a plurality of heat spreader mounting mechanisms 132. In an example, heat spreader mounting mechanisms 132 can be screws, bolts, securing means, etc. that extend through substrate 120 and secure to heat spreader mounting bracket 126 (e.g., substrate attachment posts on heat spreader mounting bracket 126).

Figure 7:
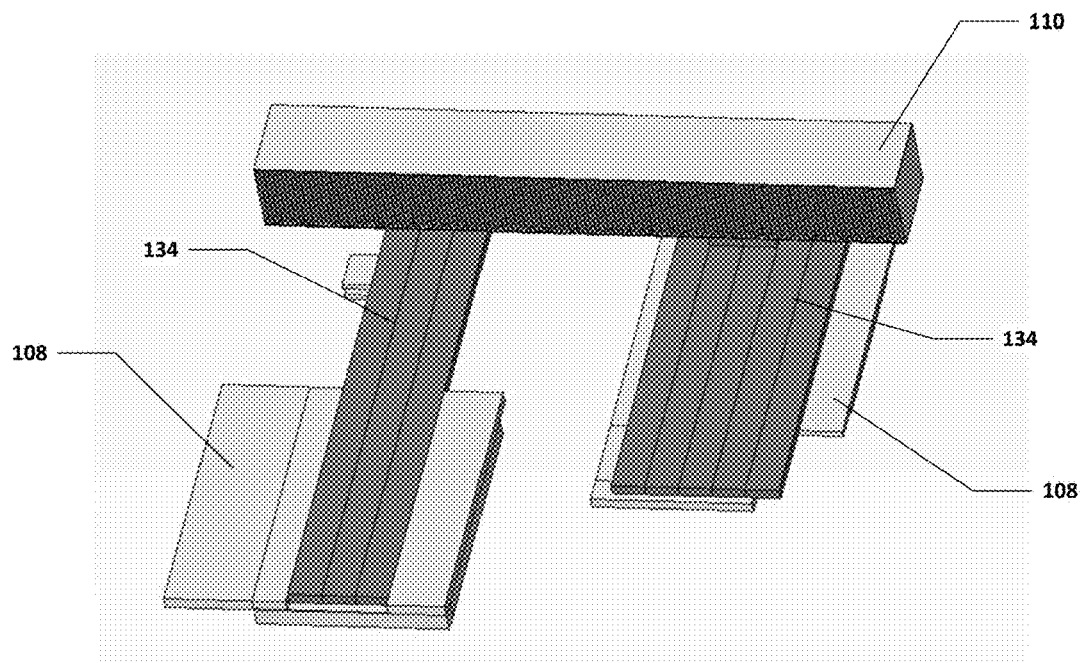
FIG. 7 is a simplified block diagram of a portion of electronic device configured to help mitigate heat in the electronic device, in accordance with an embodiment of the present disclosure.

Turning to FIG. 7, FIG. 7 is a simplified top view of a portion of electronic device 102 configured to mitigate heat in electronic device 102. In an example, heat spreader 108 can be coupled to heat sink 110. In an example, a top side of heat spreader 108 can include one or more heat pipes 134. In some example, portions of heat spreader 108 may have a channel to accommodate one or more heat pipes 134 so the top side of heat spreader 108 is relatively flat. Heat spreader 108 can be can be configured to collect heat from one or more heat sources and transfer the collected heat to heat sink 110. Heat pipes 134 can be configured to help heat spreader 108 transfer the collected heat from heat sources 104 to heat sink 110. Heat sink 110 can be configured as an air-cooling system to help transfer the heat collected by heat spreader 108 to the environment around electronic device 102.

Figure 8:
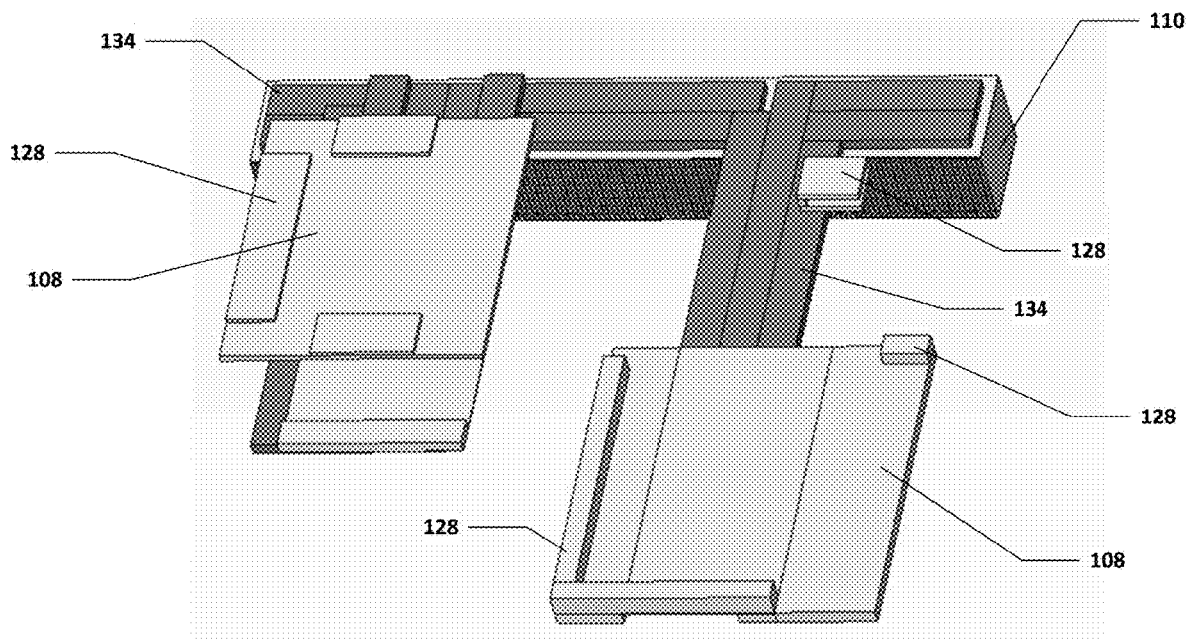
FIG. 8 is a simplified block diagram of a portion of electronic device configured to help mitigate heat in the electronic device, in accordance with an embodiment of the present disclosure.

Turning to FIG. 8, FIG. 8 is a simplified bottom view of a portion of electronic device 102 configured to mitigate heat in electronic device 102. In an example, heat spreader 108 can be coupled to heat sink 110. In an example, a top side of heat spreader 108 can include one or heat pipes 134. Heat spreader 108 can be can be configured collect heat from one or more heat sources and transfer the collected heat to heat sink 110. Heat pipes 134 can be configured to help heat spreader 108 transfer the collected heat from heat sources 104 to heat sink 110. A bottom side of heat spreader 108 can include one or more heat spreader mounting brackets 126 (not shown) and one or more support pedestals 128. In addition, a bottom side of one or more heat pipes 134 can include one or more support pedestals 128. Support pedestals 128 help to account for the height difference of different heat sources (e.g., heat source 104) and components (e.g., electronic components 106) and help to provide structural support for heat spreader 108 and heat pipe 134.

Figure 9:
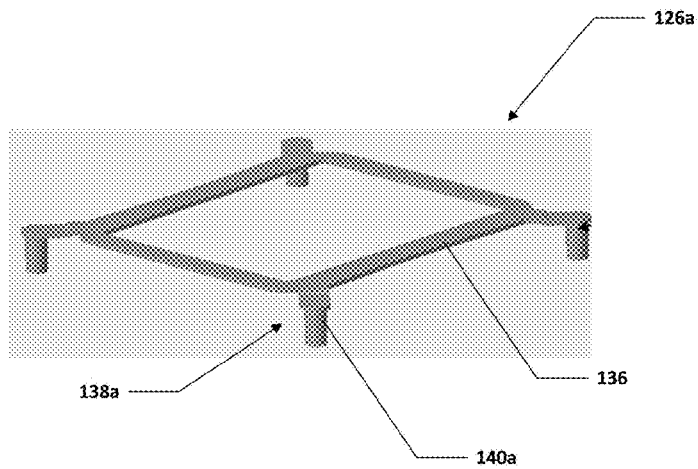
FIG. 9 is a simplified block diagram of a portion of electronic device configured to help mitigate heat in the electronic device, in accordance with an embodiment of the present disclosure.

Turning to FIG. 9, FIG. 9 is a simplified perspective view of heat spreader mounting bracket 126a. Heat spreader mounting bracket 126a can include a main body 136 and one or more attachment arms 138a. Main body 136 is configured to extend around a heat source (e.g. heat source 104). The profile and size of main body 136 depends on the profile and size of the heat source associated with heat spreader mounting bracket 126a and design constraints (e.g., obstacles on the motherboard, etc.). Attachment arms 138a can extend from main body 136 and can include substrate attachment posts 140a. The height and location of attachment arms 138a and substrate attachment posts 140a depends on the height of the heat source associated with heat spreader mounting bracket 126a.

Heat spreader mounting bracket 126a can be secured to the bottom side of heat spreader 108 without compromising heat spreader 108 or requiring through holes in heat spreader 108. In an example, heat spreader mounting bracket 126a is secured to the bottom side of heat spreader 108 using solder, tape, adhesive, or some other means of securing heat spreader mounting bracket 126a to the bottom side of heat spreader 108 without compromising heat spreader 108 or requiring through holes in heat spreader 108. Heat spreader mounting mechanisms 132 (illustrated in FIG. 6) can go through substrate 120 to substrate attachment posts 140a to help secure heat spreader mounting bracket 126a and heat spreader 108 to substrate 120.

Figure 10:
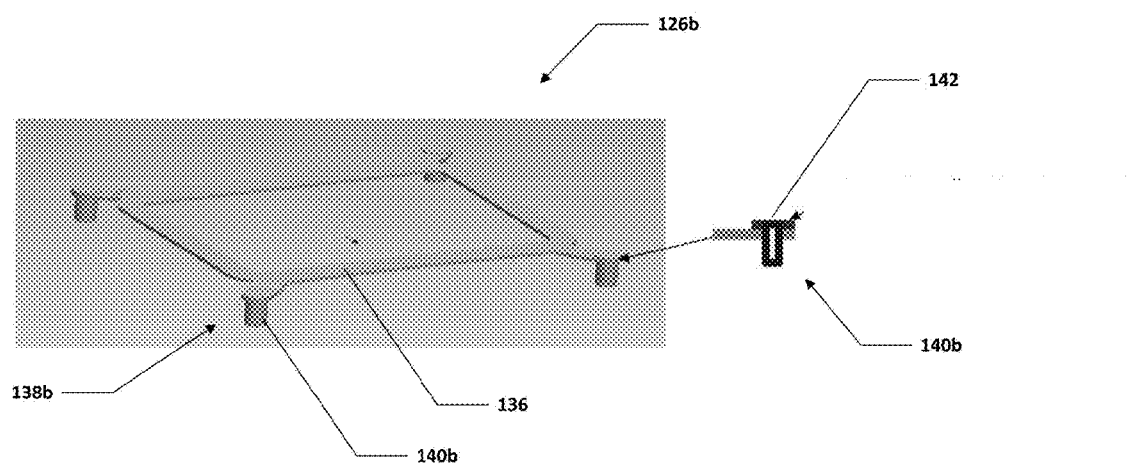
FIG. 10 is a simplified block diagram of a portion of electronic device configured to help mitigate heat in the electronic device, in accordance with an embodiment of the present disclosure.

Turning to FIG. 10, FIG. 10 is a simplified perspective view of heat spreader mounting bracket 126b. Heat spreader mounting bracket 126b can include a main body 136 and one or more attachment arms 138b. Main body 136 is configured to extend around a heat source (e.g. heat source 104). The profile and size of main body 136 depends on the profile and size of the heat source associated with heat spreader mounting bracket 126b. Attachment arms 138b can extend from main body 136 and can include substrate attachment post 140b. The height and location of attachment arms 138b and substrate attachment posts 140b depends on the height of the heat source associated with heat spreader mounting bracket 126. Substrate attachment posts 140b can include a tab 142 that extends over a portion of attachment arm 138b to help secure substrate attachment post 140b to attachment arm 138b and main body 136 of heat spreader mounting bracket 126b.

Heat spreader mounting bracket 126b can be secured to the bottom side of heat spreader 108 without compromising heat spreader 108 or requiring through holes in heat spreader 108. In an example, heat spreader mounting bracket 126b is secured to the bottom side of heat spreader 108 using solder, tape, adhesive, or some other means of securing heat spreader mounting bracket 126b to the bottom side of heat spreader 108 without compromising heat spreader 108 or requiring through holes in heat spreader 108. Heat spreader mounting mechanisms 132 (illustrated in FIG. 6) can go through substrate 120 to substrate attachment posts 140b to help secure heat spreader mounting bracket 126b and heat spreader 108 to substrate 120. In some examples, tab 142 on substrate attachment post 140b allows for a greater force to be applied to heat spreader mounting bracket 126b as compared to a force that can be applied to heat spreader mounting bracket 126a using substrate attachment posts 140a (Illustrated in FIG. 9).

Figure 11:
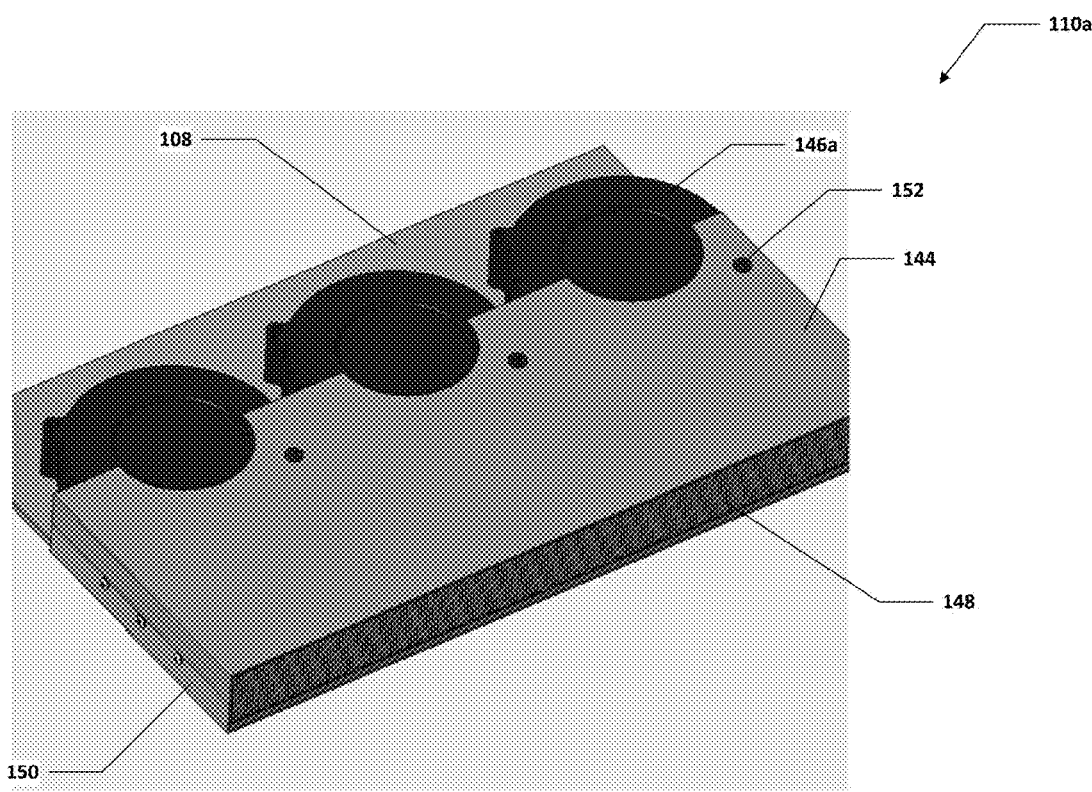
FIG. 11 is a simplified block diagram of a portion of electronic device configured to help mitigate heat in the electronic device, in accordance with an embodiment of the present disclosure.

Turning to FIG. 11, FIG. 11 is a simplified perspective view of heat sink 110a. Heat sink 110a can include an upper duct housing 144, one or more fans 146a, fins 148, and a duct base 150. Heat spreader 108 can be coupled to heat sink 110a to help transfer the heat collected by heat spreader 108 to the environment. More specifically, heat spreader 108 can be thermally coupled to fins 148. One or more fans 146a can blow or move air across fins 148 to help cool fins 148 and transfer the heat collect by fins 148 to the environment. As illustrated in FIG. 11, one or more fans 146a includes three fans. Upper duct housing 144 can be coupled to one or more fans 146 using upper duct fasteners 152. Duct base 150 can be coupled to upper duct housing 144 using duct base fasteners 154. Fins 148 can be comprised of a material that helps to dissipate heat for example, copper, aluminum, or some other material that can be used as fins to dissipate heat.

Figure 12:
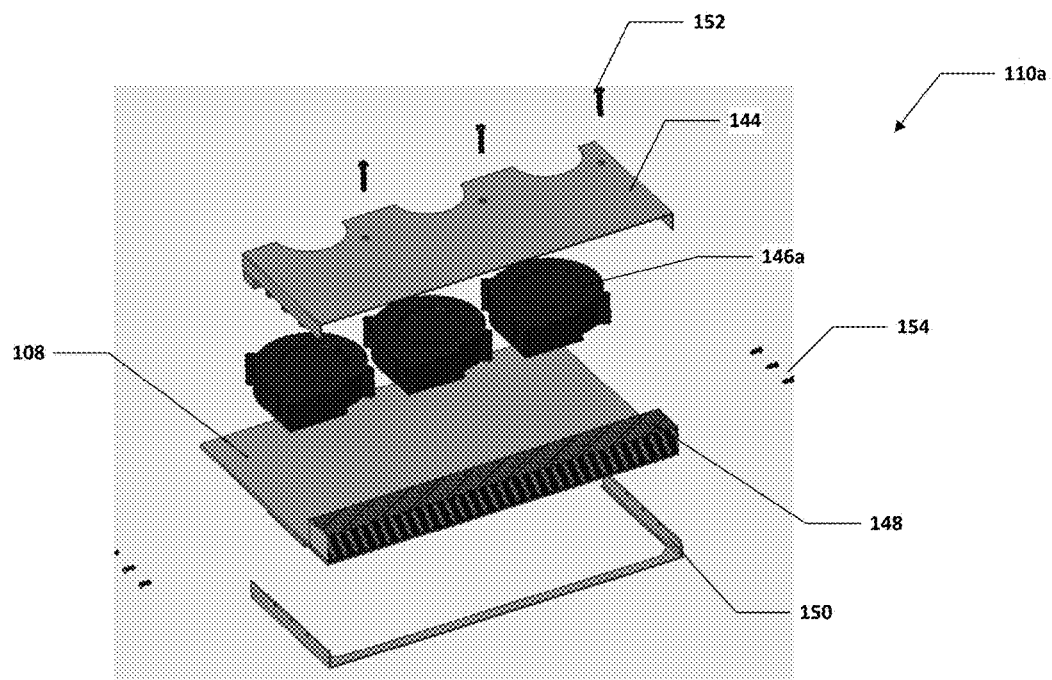
FIG. 12 is a simplified block diagram of a portion of electronic device configured to help mitigate heat in the electronic device, in accordance with an embodiment of the present disclosure.

Turning to FIG. 12, FIG. 12 is a simplified exploded view of heat sink 110a. Heat sink 110a can include upper duct housing 144, one or more fans 146a, fins 148, and duct base 150. Heat spreader 108 can be coupled to heat sink 110a to help transfer the heat collected by heat spreader 108 to the environment. Upper duct housing 144 can be coupled to one or more fans 146a using upper duct fasteners 152. Duct base 150 can be coupled to upper duct housing 144 using duct base fasteners 154. Heat spreader 108 can be thermally coupled to fins 148.

Figure 13:
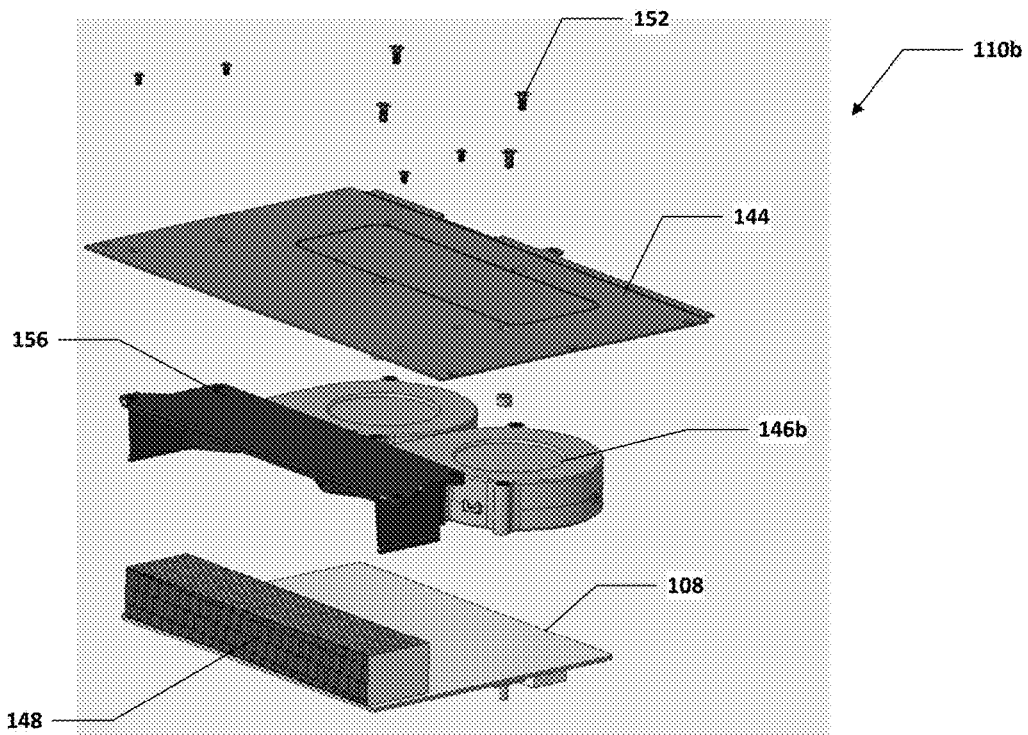
FIG. 13 is a simplified block diagram of a portion of electronic device configured to help mitigate heat in the electronic device, in accordance with an embodiment of the present disclosure.

Turning to FIG. 13, FIG. 13 is a simplified exploded top view of heat sink 110b. Heat sink 110b can include upper duct housing 144, one or more fans 146b, fins 148, and an air guide 156. As illustrated in FIG. 13, one or more fans 136b includes two fans. Heat spreader 108 can be coupled to heat sink 110b to help transfer the heat collected by heat spreader 108 to the environment. Upper duct housing 144 can be coupled to one or more fans 146b using upper duct fasteners 152. Heat spreader 108 can be thermally coupled to fins 148. Air guide 156 can help direct the air from one or more fans 146b to fins 148.

Figure 14:
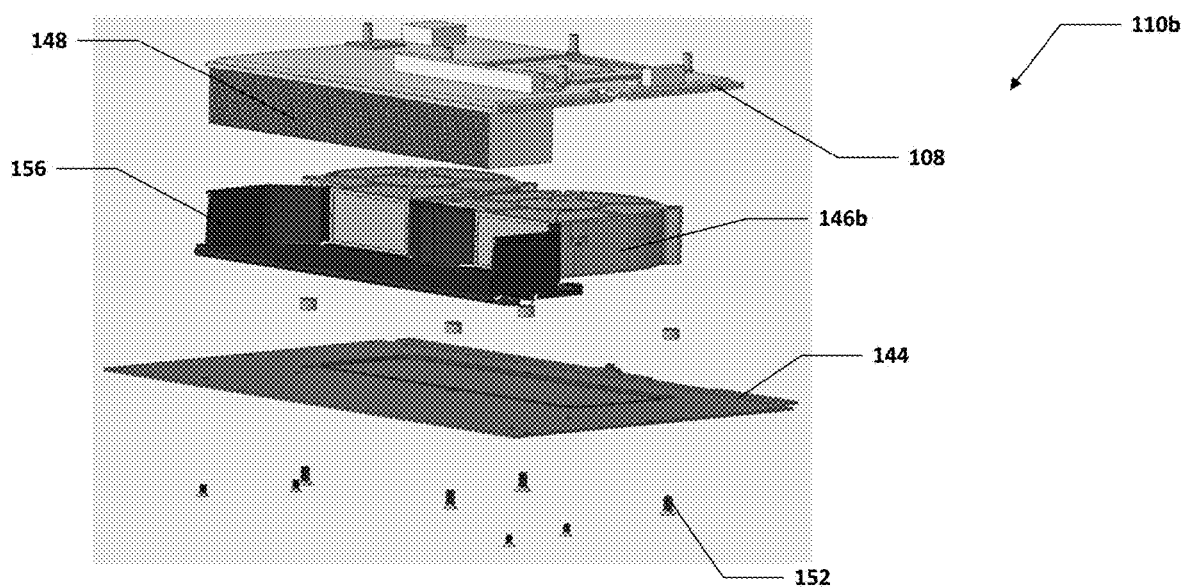
FIG. 14 is a simplified block diagram of a portion of electronic device configured to help mitigate heat in the electronic device, in accordance with an embodiment of the present disclosure.

Turning to FIG. 14, FIG. 14 is a simplified exploded bottom view of heat sink 110b. Heat sink 110b can include upper duct housing 144, one or more fans 146b, fins 148, and air guide 156. Heat spreader 108 can be coupled to heat sink 110b to help transfer the heat collected by heat spreader 108 to the environment. Upper duct housing 144 can be coupled to one or more fans 146b using upper duct fasteners 152. Duct base 150 can be coupled to upper duct housing 144 using duct base fasteners 154. Heat spreader 108 can be thermally coupled to fins 148. Air guide 156 can help direct the air from one or more fans 146b to fins 148.

Figure 15:
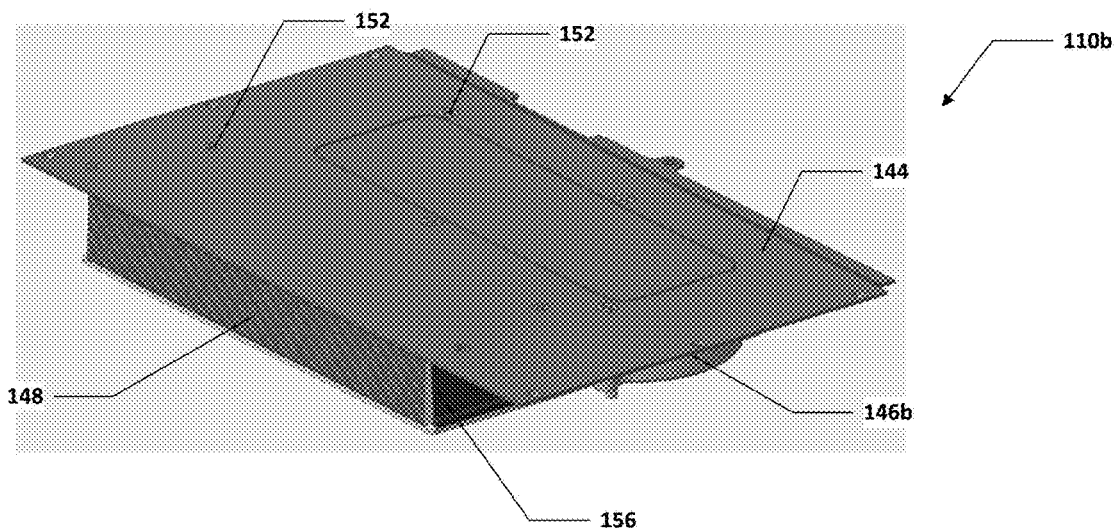
FIG. 15 is a simplified block diagram of a portion of electronic device configured to help mitigate heat in the electronic device, in accordance with an embodiment of the present disclosure.

Turning to FIG. 15, FIG. 15 is a simplified top view of heat sink 110b. Heat sink 110b can include upper duct housing 144, one or more fans 146b, fins 148, and air guide 156. Upper duct housing 144 can be coupled to one or more fans 146b using upper duct fasteners 152. Air guide 156 can help direct the air from one or more fans 146b to fins 148.

Figure 16:
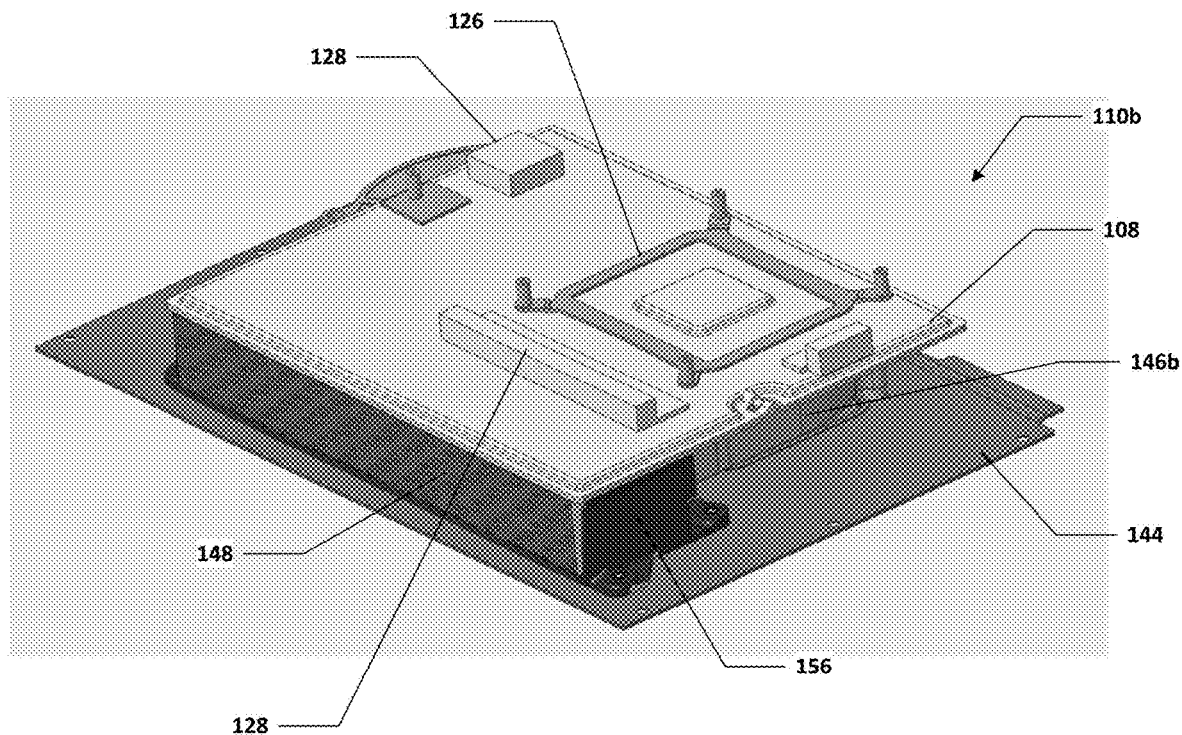
FIG. 16 is a simplified block diagram of a portion of electronic device configured to help mitigate heat in the electronic device, in accordance with an embodiment of the present disclosure.

Turning to FIG. 16, FIG. 16 is a simplified bottom view of heat sink 110b. Heat sink 110b can include upper duct housing 144, one or more fans 146b, fins 148, and air guide 156. Heat spreader 108 can be coupled to heat sink 110b to help transfer the heat collected by heat spreader 108 to the environment. Heat spreader 108 can include one or more heat spreader mounting brackets 126 and one or more support pedestals 128. Heat spreader 108 can be thermally coupled to fins 148. Air guide 156 can help direct the air from one or more fans 146b to fins 148.

Figure 17:
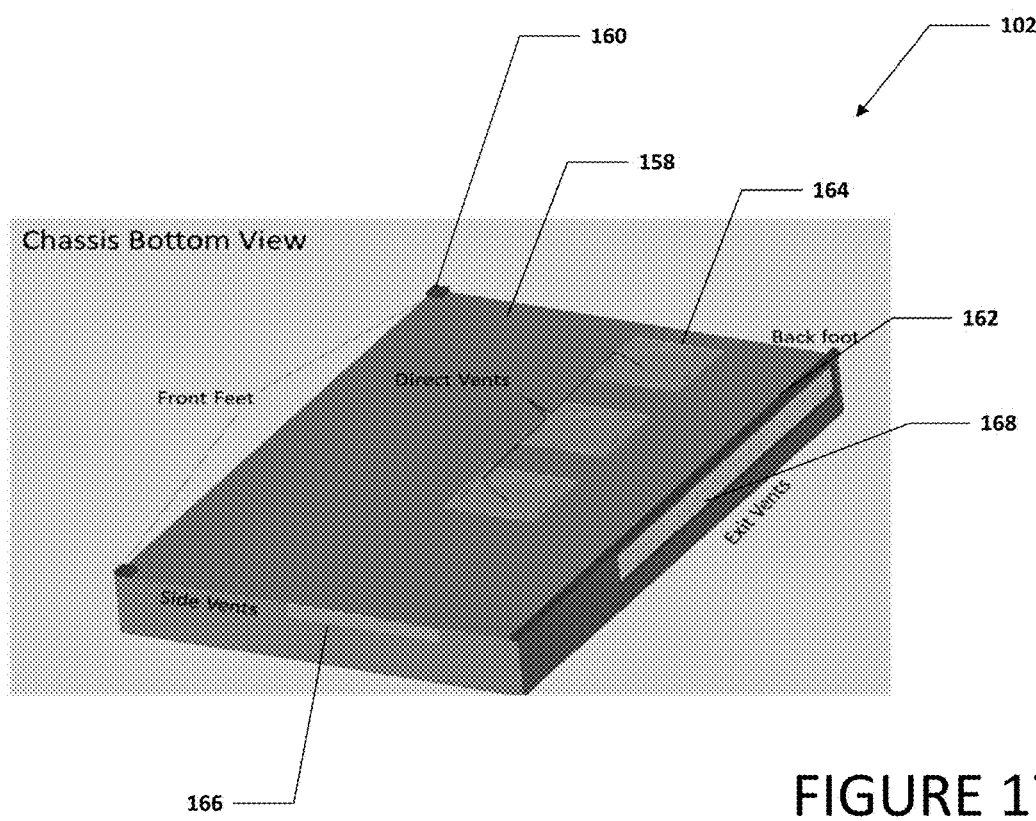
FIG. 17 is a simplified block diagram of a portion of electronic device configured to help mitigate heat in the electronic device, in accordance with an embodiment of the present disclosure.

Turning to FIG. 17, FIG. 17 is a simplified bottom view of electronic device 102. Electronic device 102 can include a chassis 158, one or more front feet 160, and a back foot 162. Chassis 158 can include one or more bottom inlet vents 164, one or more side inlet vents 166, and one or more exhaust vents 168. One or more fans (e.g., one or more fans 146a or 146b) can cause air from around chassis 158 to be drawn in through one or more bottom inlet vents 164 and one or more side inlet vents 166 and forced over fins 148 and out exhaust vent 168.

Figure 18:
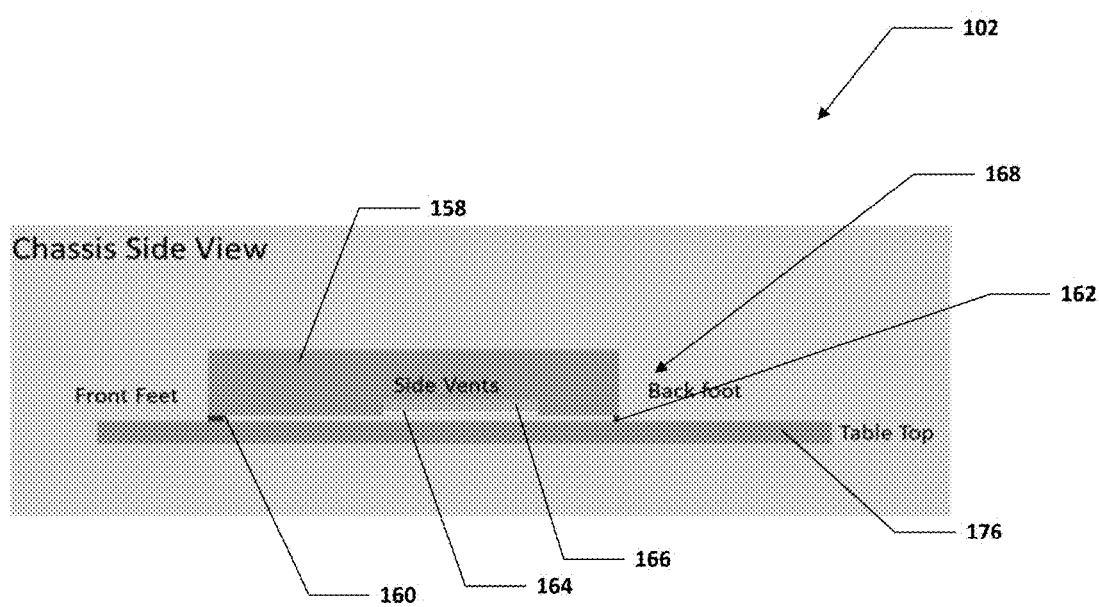
FIG. 18 is a simplified block diagram of a portion of electronic device configured to help mitigate heat in the electronic device, in accordance with an embodiment of the present disclosure.

Turning to FIG. 18, FIG. 18 is a simplified side view of electronic device 102 on a relatively flat surface 176. In an example, relatively flat surface 176 is a table top. Electronic device 102 can include chassis 158, one or more front feet 160, and back foot 162. Chassis 158 can include one or more bottom inlet vents 164, one or more side inlet vents 166, and one or more exhaust vents 168. When electronic device is on relatively flat surface 176, one or more front feet 160 and back foot 162 elevate chassis 158 off of surface 176 and allow air to be drawn in through one or more bottom inlet vents 164. For example, one or more fans (e.g., one or more fans 146a or 146b) can cause air from around chassis 158 can be drawn in through one or more bottom inlet vents 164 and one or more side inlet vents 166 and forced over and through fins 148 and out exhaust vent 168. Back foot 162 can extend at least partially along the length of chassis and help to prevent the relatively hot air from exhaust vent 168 from being drawn in through one or more bottom inlet vents 164 and one or more side inlet vents 166.

Figure 19:
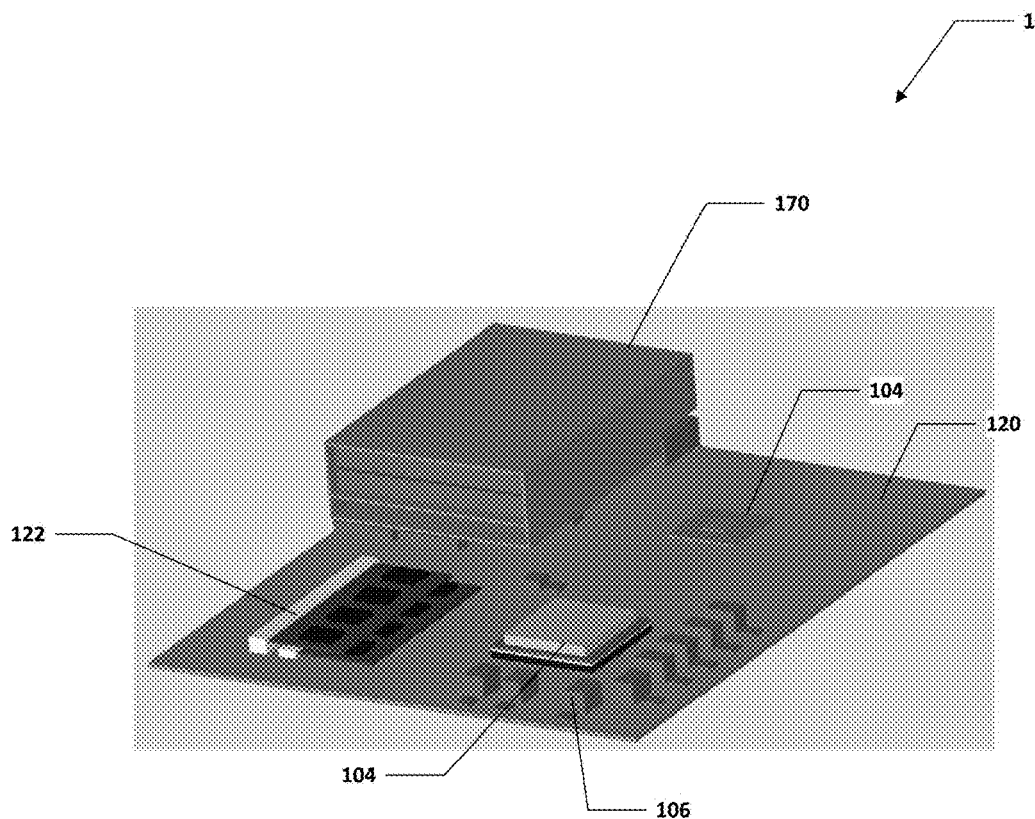
FIG. 19 is a simplified block diagram of a portion of electronic device configured to help mitigate heat in the electronic device, in accordance with an embodiment of the present disclosure.

Turning to FIG. 19, FIG. 19 is a simplified view of a portion of electronic device 102c. Electronic device 102c can include a substrate 120, one or more heat sources 104 on substrate 120, one or more electronic components 106 on substrate 120, one or more removable components 122 on substrate 120, and a hard drive bay 170. Hard drive bay 170 can house one or more hard drives. The base of 174 can be configured to contact and cool components on the substrate.

Figure 20:
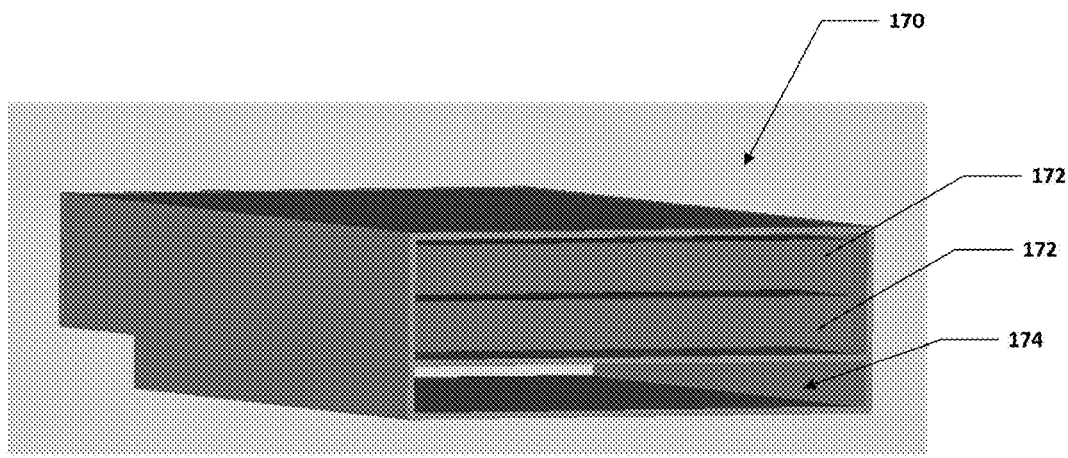
FIG. 20 is a simplified block diagram of a portion of electronic device configured to help mitigate heat in the electronic device, in accordance with an embodiment of the present disclosure.

Turning to FIG. 20, FIG. 20 is a simplified view of hard drive bay 170. Hard drive bay 170 can include one or more hard drive housing slots 172 and a channel 174. Channel 174 can be under one or more hard drive housing slots 172 and allow air to circulate through hard drive bay 170. This helps to cool hard drives in each of one or more hard device housing slots 172.

Figure 21:
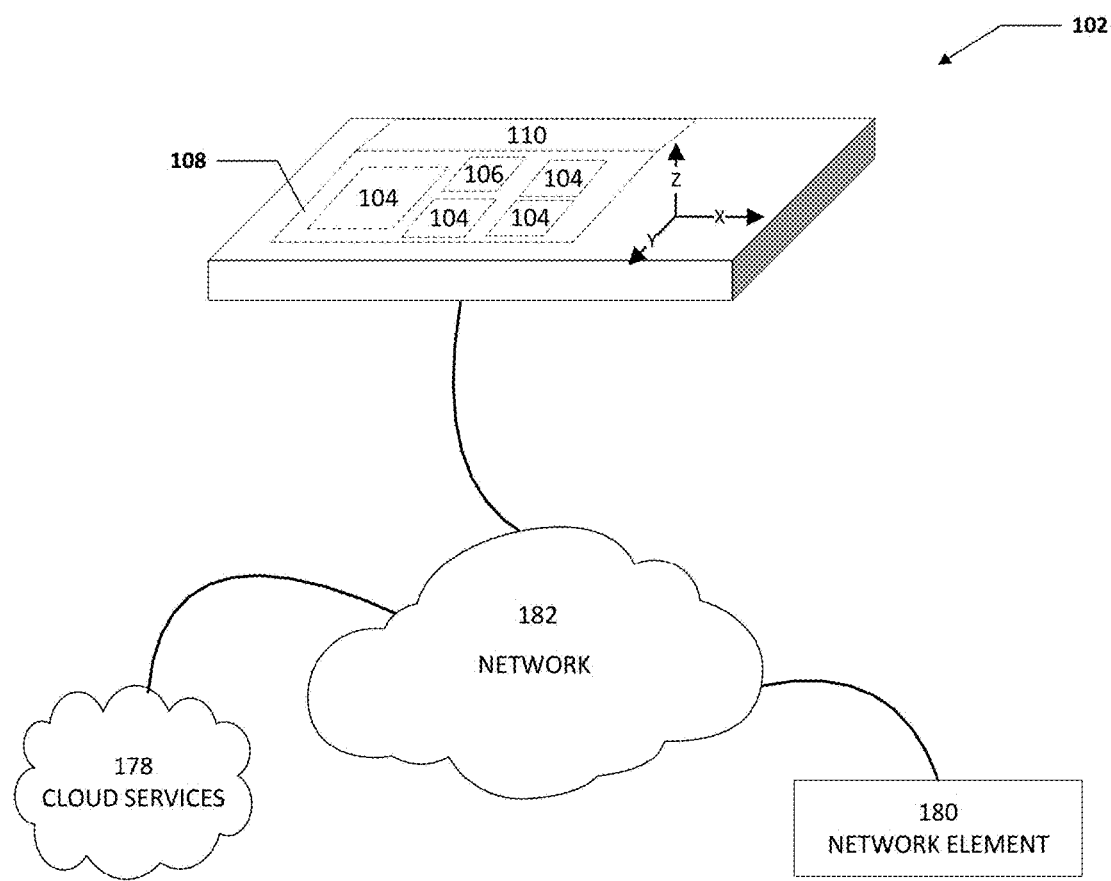
FIG. 21 is a simplified block diagram of a electronic device configured to help mitigate heat in the electronic device, in accordance with an embodiment of the present disclosure.

Turning to FIG. 21, FIG. 21 is a simplified block diagram of a portion of electronic device 102 configured to mitigate heat in electronic device 102. In an example, electronic device 102 can include one or more heat sources 104, one or more electronic components 106, a heat spreader 108, and a heat sink 110. Electronic device 102 may be in communication with cloud services 178 and/or network element 180 using network 182. In an example, electronic device 102 is a standalone device and not connected to network 182.

Elements of FIG. 21 may be coupled to one another through one or more interfaces employing any suitable connections (wired or wireless), which provide viable pathways for network (e.g., network 182, etc.) communications. Additionally, any one or more of these elements of FIG. 21 may be combined or removed from the architecture based on particular configuration needs. Network 182 may include a configuration capable of transmission control protocol/Internet protocol (TCP/IP) communications for the transmission or reception of packets in a network. Electronic device 102 may also operate in conjunction with a user datagram protocol/IP (UDP/IP) or any other suitable protocol where appropriate and based on particular needs.

Turning to the infrastructure of FIG. 21, network 182 represents a series of points or nodes of interconnected communication paths for receiving and transmitting packets of information. Network 182 offers a communicative interface between nodes, and may be configured as any local area network (LAN), virtual local area network (VLAN), wide area network (WAN), wireless local area network (WLAN), metropolitan area network (MAN), Intranet, Extranet, virtual private network (VPN), and any other appropriate architecture or system that facilitates communications in a network environment, or any suitable combination thereof, including wired and/or wireless communication.

In network 182, network traffic, which is inclusive of packets, frames, signals, data, etc., can be sent and received according to any suitable communication messaging protocols. Suitable communication messaging protocols can include a multi-layered scheme such as Open Systems Interconnection (OSI) model, or any derivations or variants thereof (e.g., Transmission Control Protocol/Internet Protocol (TCP/IP), user datagram protocol/IP (UDP/IP)). Messages through the network could be made in accordance with various network protocols, (e.g., Ethernet, Infiniband, OmniPath, etc.). Additionally, radio signal communications over a cellular network may also be provided. Suitable interfaces and infrastructure may be provided to enable communication with the cellular network.

The term "packet" as used herein, refers to a unit of data that can be routed between a source node and a destination node on a packet switched network. A packet includes a source network address and a destination network address. These network addresses can be Internet Protocol (IP) addresses in a TCP/IP messaging protocol. The term "data" as used herein, refers to any type of binary, numeric, voice, video, textual, or script data, or any type of source or object code, or any other suitable information in any appropriate format that may be communicated from one point to another in electronic devices and/or networks. The data may help determine a status of a network element or network. Additionally, messages, requests, responses, and queries are forms of network traffic, and therefore, may comprise packets, frames, signals, data, etc.

Although the present disclosure has been described in detail with reference to particular arrangements and configurations, these example configurations and arrangements may be changed significantly without departing from the scope of the present disclosure. Moreover, certain components may be combined, separated, eliminated, or added based on particular needs and implementations. Additionally, although electronic device 102 has been illustrated with reference to particular elements and operations that facilitate the thermal cooling process, these elements and operations may be replaced by any suitable architecture, protocols, and/or processes that achieve the intended functionality disclosed herein.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

Other Notes and Examples

Example A1, is an electronic device including a substrate, a plurality of heat sources on the substrate, a heat spreader that extends over the plurality of heat sources, and a plurality of heat spreader mounting brackets, where each of the plurality of heat spreader mounting brackets are over a corresponding heat source from the plurality of heat sources and the plurality of heat spreaders secure the heat spreader to the substrate without extending through the heat spreader.

In Example A2, the subject matter of Example A1 can optionally include where the heat spreader is a vapor chamber.

In Example A3, the subject matter of any one of Examples A1-A2 can optionally include where the plurality of heat spreader mounting brackets are soldered to the heat spreader.

In Example A4, the subject matter of any one of Examples A1-A3 can optionally include pedestals, where the pedestals are located on a bottom side of the heat spreader and accommodate a height difference of the plurality of heat sources and allow a top side of the heat spreader to be relatively flat.

In Example A5, the subject matter of any one of Examples A1-A4 can optionally include where the pedestals are secured to the heat spreader after the heat spreader is manufactured.

In Example A6, the subject matter of any one of Examples A1-A5 can optionally include where the electronic device includes front feet and a back foot and the back foot helps to prevent exhaust air from a heat sink from reentering the electronic device.

In Example A7, the subject matter of any one of Examples A1-A6 can optionally include where the electronic device is a compact desktop system that does not include a display.

Example M1 is a method including identifying a location of each of a plurality of heat sources on a substrate and attaching a plurality of heat spreader mounting brackets to a heat spreader that will extend over the plurality of heat sources, where each of the plurality of heat spreader mounting brackets are over a corresponding heat source from the plurality of heat sources and the plurality of heat spreaders secure the heat spreader to the substrate without extending through the heat spreader.

In Example M2, the subject matter of Example M1 can optionally include where the heat spreader is a vapor chamber.

In Example M3, the subject matter of any one of the Examples M1-M2 can optionally include where the plurality of heat spreader mounting brackets are soldered to the heat spreader.

In Example M4, the subject matter of any one of the Examples M1-M3 can optionally include where securing pedestals to a bottom side of the heat spreader and accommodate a height difference of the plurality of heat sources and allow a top side of the heat spreader to be relatively flat.

In Example M5, the subject matter of any one of the Examples M1-M4 can optionally include where the substrate and plurality of heat sources are located in an electronic device that includes front feet and a back foot and the back foot help to prevent exhaust air from a heat sink from reentering the electronic device.

In Example M6, the subject matter of any one of the Examples M1-M5 can optionally include where the electronic device is a compact desktop system that does not include a display.

Example S1 is a compact desktop system including a substrate, a plurality of heat sources on the substrate, where one of the heat sources is removable memory, a heat spreader that extends over the plurality of heat sources except for the removable memory, and a plurality of heat spreader mounting brackets, where each of the plurality of heat spreader mounting brackets are over a corresponding heat source from the plurality of heat sources and the plurality of heat spreader mounting brackets secure the heat spreader to the substrate without extending through the heat spreader.

In Example S2, the subject matter of Example S1 can optionally include where the heat spreader is a vapor chamber.

In Example S3, the subject matter of any one of the Examples S1-S2 can optionally include where the plurality of heat spreader mounting brackets are soldered to the heat spreader.

In Example S4, the subject matter of any one of the Examples S1-S3 can optionally include pedestals, where the pedestals are located on a bottom side of the heat spreader and accommodate a height difference of the plurality of heat sources and allow a top side of the heat spreader to be relatively flat.

In Example S5, the subject matter of any one of the Examples S1-S4 can optionally include where the pedestals are secured to the heat spreader after the heat spreader is manufactured.

In Example S6, the subject matter of any one of the Examples S1-S5 can optionally include where the compact desktop system includes front feet and a back foot and the back foot help to prevent exhaust air from a heat sink from reentering the compact desktop system.

In Example S7, the subject matter of any one of the Examples S1-S6 can optionally include where the plurality of heat sources include a computer processing unit, graphics processing unit, and a voltage regulator.

What is claimed is:

1. An electronic device, comprising:
   a substrate;
   a plurality of heat sources arranged on the substrate;
   a vapor chamber arranged to extend over the plurality of heat sources, in which the plurality of heat sources and the substrate are arranged on the vapor chamber; and
   a plurality of heat spreader mounting brackets, wherein each of the plurality of heat spreader mounting brackets is arranged adjacent to and over a corresponding heat source from the plurality of heat sources, and that the plurality of heat spreader mounting brackets are further arranged to secure the vapor chamber to the substrate without using mounting holes in the vapor chamber,
   wherein the plurality of heat sources and the substrate are intermediate the plurality of heat spreader mounting brackets and the vapor chamber; and
   wherein each heat spreader mounting bracket comprises a main body configured to extend over the corresponding heat source, and a plurality of attachment arms extending from the main body, in which each attachment arm comprises a substrate attachment post configured to enable a heat spreader mounting bracket of the plurality of heat spreader mounting brackets to be secured to the substrate using a heat spreader mounting mechanism, and
   wherein each substrate attachment post is configured with a corresponding tab that extends over a portion of an associated attachment arm to help secure said substrate attachment post to the associated attachment arm and the main body.

2. The electronic device of claim 1, wherein the plurality of heat spreader mounting brackets are soldered to the vapor chamber.

3. The electronic device of claim 1, further comprising: pedestals, wherein the pedestals are located on a bottom side of the vapor chamber and accommodate a height difference of the plurality of heat sources and allow a top side of the vapor chamber to be relatively flat.

4. The electronic device of claim 3, wherein the pedestals are secured to the vapor chamber after the vapor chamber is manufactured.

5. The electronic device of claim 1, wherein the electronic device includes front feet and a back foot, and the back foot helps to prevent exhaust air from a heat sink from reentering the electronic device.

6. The electronic device of claim 1, wherein the electronic device is a compact desktop system that does not include a display.

7. The electronic device of claim 1, wherein the heat spreader mounting mechanism is configured to extend through the substrate and to couple with said substrate attachment post to enable said heat spreader mounting bracket to be secured over the corresponding heat source.

8. The electronic device of claim 7, wherein the heat spreader mounting mechanism includes a screw or a bolt.

9. A method, comprising:
   identifying a location of each of a plurality of heat sources on a substrate; and
   attaching a plurality of heat spreader mounting brackets to a vapor chamber that is arranged to extend over the plurality of heat sources, wherein each of the plurality of heat spreader mounting brackets is arranged adjacent to and over a corresponding heat source from the plurality of heat sources and that the plurality of heat spreader mounting brackets are further arranged to secure the vapor chamber to the substrate without using mounting holes in the vapor chamber,
   wherein the plurality of heat sources and the substrate are intermediate the plurality of heat spreader mounting brackets and the vapor chamber; and
   wherein each heat spreader mounting bracket comprises a main body configured to extend over the corresponding heat source, and a plurality of attachment arms extending from the main body, in which each attachment arm comprises a substrate attachment post configured to enable a heat spreader mounting bracket of the plurality of heat spreader mounting brackets to be secured to the substrate using a heat spreader mounting mechanism, and
   wherein each substrate attachment post is configured with a corresponding tab that extends over a portion of an associated attachment arm to help secure said substrate attachment post to the associated attachment arm and the main body.

10. The method of claim 9, wherein the plurality of heat spreader mounting brackets are soldered to the vapor chamber.

11. The method of claim 9, further comprising:
    securing pedestals to a bottom side of the vapor chamber and accommodate a height difference of the plurality of heat sources and allow a top side of the vapor chamber to be relatively flat.

12. The method of claim 9, wherein the substrate and plurality of heat sources are located in an electronic device that includes front feet and a back foot, and the back foot helps to prevent exhaust air from a heat sink from reentering the electronic device.

13. A compact desktop system, comprising:
    a substrate;
    a plurality of heat sources arranged on the substrate, wherein one of the heat sources is removable memory;
    a vapor chamber arranged to extend over the plurality of heat sources except for the removable memory, in which the plurality of heat sources and the substrate are arranged on the vapor chamber; and
    a plurality of heat spreader mounting brackets, wherein each of the plurality of heat spreader mounting brackets is arranged adjacent to and over a corresponding heat source from the plurality of heat sources and that the plurality of heat spreader mounting brackets are further arranged to secure the vapor chamber to the substrate without using mounting holes in the vapor chamber,
    wherein the plurality of heat sources and the substrate are intermediate the plurality of heat spreader mounting brackets and the vapor chamber; and
    wherein each heat spreader mounting bracket comprises a main body configured to extend over the corresponding heat source, and a plurality of attachment arms extending from the main body, in which each attachment arm comprises a substrate attachment post configured to enable a heat spreader mounting bracket of the plurality of heat spreader mounting brackets to be secured to be secured to the substrate using a heat spreader mounting mechanism, and wherein each substrate attachment post is configured with a corresponding tab that extends over a portion of an associated attachment arm to help secure said substrate attachment post to the associated attachment arm and the main body.

14. The compact desktop system of claim 13, further comprising:
pedestals, wherein the pedestals are located on a bottom side of the vapor chamber and accommodate a height difference of the plurality of heat sources and allow a top side of the vapor chamber to be relatively flat.

15. The compact desktop system of claim 14, wherein the pedestals are secured to the vapor chamber after the vapor chamber is manufactured.

* * * * *